United States Patent
Karaki et al.

(10) Patent No.: US 9,090,512 B2
(45) Date of Patent: Jul. 28, 2015

(54) ANISOTROPICALLY SHAPED POWDER AND METHOD FOR PRODUCING THE SAME

(75) Inventors: Tomoaki Karaki, Imizu (JP); Fan Zhang, Heping District (CN)

(73) Assignees: TOYAMA PREFECTURE, Toyama (JP); HITACHI METALS, LTD., Tokyo (JP)

( * ) Notice: Subject to any disclaimer, the term of this patent is extended or adjusted under 35 U.S.C. 154(b) by 350 days.

(21) Appl. No.: 13/510,459

(22) PCT Filed: Nov. 24, 2010

(86) PCT No.: PCT/JP2010/070898
§ 371 (c)(1),
(2), (4) Date: Sep. 10, 2012

(87) PCT Pub. No.: WO2011/065367
PCT Pub. Date: Jun. 3, 2011

(65) Prior Publication Data
US 2012/0328878 A1    Dec. 27, 2012

(30) Foreign Application Priority Data
Nov. 26, 2009    (JP) ................. 2009-268398

(51) Int. Cl.
*C04B 35/495*    (2006.01)
*C01G 33/00*    (2006.01)
(Continued)

(52) U.S. Cl.
CPC ............ *C04B 35/495* (2013.01); *C01G 33/006* (2013.01); *C04B 35/62675* (2013.01);
(Continued)

(58) Field of Classification Search
None
See application file for complete search history.

(56) References Cited

U.S. PATENT DOCUMENTS

| 6,534,025 B1 | 3/2003 | Yano et al. |
| 2003/0008762 A1 | 1/2003 | Takao et al. |

(Continued)

FOREIGN PATENT DOCUMENTS

| CN | 101092244 A | * 12/2007 |
| JP | A-2001-157815 | 6/2001 |

(Continued)

OTHER PUBLICATIONS

Zhang, Fan et al., "Hydrothermal Synthesis of (K,Na)NbO$_3$ Particles," Japanese Journal of Applied Physics, 2008, vol. 47, No. 9, pp. 7685-7688.

(Continued)

*Primary Examiner* — Steven Bos
(74) *Attorney, Agent, or Firm* — Oliff PLC

(57) ABSTRACT

There is provided an anisotropically shaped powder preferred as plate-like crystals used in the process of producing niobate-based KNbO$_3$—NaNbO$_3$—LiNbO$_3$-based crystal-oriented ceramics and the like, and a method for producing the same. The production method includes, an oxide powder, such as Nb$_2$O$_5$, and a surfactant are added to an aqueous solution of alkali hydroxides, such as NaOH and KOH to perform hydrothermal synthesis, the product obtained after this reaction is washed with an organic solvent, and further, the product after the washing is fired at 170° C. to 700° C. In addition, according to this production method, it is possible to obtain an anisotropically shaped powder having a ratio of an average particle length in a major axis direction to an average particle length in a thickness direction in the range of 2 to 20 and having a pseudo-cubic perovskite structure in which a crystal face is oriented in a (100) plane.

3 Claims, 16 Drawing Sheets

(51) Int. Cl.
  *C04B 35/626* (2006.01)
  *H01L 41/187* (2006.01)
  *H01L 41/43* (2013.01)

(52) U.S. Cl.
  CPC ............ *H01L41/1873* (2013.01); *H01L 41/43* (2013.01); *C01P 2002/72* (2013.01); *C01P 2002/76* (2013.01); *C01P 2002/77* (2013.01); *C01P 2002/88* (2013.01); *C01P 2004/03* (2013.01); *C01P 2004/04* (2013.01); *C01P 2004/62* (2013.01); *C04B 2235/3201* (2013.01); *C04B 2235/3251* (2013.01); *C04B 2235/3255* (2013.01); *C04B 2235/5292* (2013.01); *C04B 2235/5296* (2013.01); *C04B 2235/5436* (2013.01); *C04B 2235/768* (2013.01); *C04B 2235/787* (2013.01); *Y10T 428/2982* (2015.01)

(56) References Cited

U.S. PATENT DOCUMENTS

2004/0120881 A1   6/2004   Takao et al.
2008/0066496 A1   3/2008   Nagaya et al.

FOREIGN PATENT DOCUMENTS

| JP | A-2003-12373 | | 1/2003 |
| JP | 2006-306678 A | * | 11/2006 |
| JP | A-2006-306678 | | 11/2006 |
| JP | A-2007-22857 | | 2/2007 |
| JP | A-2008-74693 | | 4/2008 |
| JP | 2009-256147 A | * | 11/2009 |
| JP | 2010-159196 A | * | 7/2010 |

OTHER PUBLICATIONS

Santos, I.C.M.S. et al., "Studies on the hydrothermal synthesis of niobium oxides," Polyhedron, 2002, vol. 21, pp. 2009-2015.

Shiping, Wang et al., "Hyrdrothermal Synthesis of Sodium-Potassium Niobate Nanopowders," Key Engineering Materials, 2008, vols. 368-372, pp. 579-581.

Wang, Yi et al., "Hydrothermal synthesis of potassium niobate powders," Ceramics International, 2007, vol. 33, pp. 1611-1615.

Saito, Yasuyoshi et al., "Lead-free piezoceramics," Nature, 2004, vol. 432, pp. 84-87.

International Search Report issued in International Patent Application No. PCT/JP2010/070898 dated Dec. 28, 2010.

Japanese Office Action dated Oct. 7, 2014 issued in Japanese Patent Application No. 2010-261364 (with translation).

* cited by examiner

250°C

450°C

600°C

US 9,090,512 B2

ANISOTROPICALLY SHAPED POWDER AND METHOD FOR PRODUCING THE SAME

TECHNICAL FIELD

The present invention relates to an anisotropically shaped powder composed of oriented particles in which a particular crystal face is oriented and a method for producing the same.

RELATED ART

Recently, from increasing awareness of environmental conservation, a tendency to exclude heavy metal hazardous elements, such as Pb, Hg, Cd, and $Cr^{6+}$, has increased, and a prohibition (RoHS instruction) has been issued and enforced centered on Europe. Raw material lead oxide (PbO), which plays an important role for higher functionality of electronic materials, has also become its target because environmental problems are feared regarding disposal problems. For piezoelectric materials constituting piezoelectric devices, which have been widely put to practical use in the fields of electronics, mechatronics, automobiles, and the like, a wide variety of materials, such as single crystals, thick films, and thin films, have been developed centered on ceramics. Piezoelectric ceramics that make up the majority are Pb-based perovskite type ferroelectric ceramics. The mainstream is $PbZrO_3$—$PbTiO_3$(PZT). $PbZrO_3$—$PbTiO_3$ comprises a large amount of lead oxide as a main component and therefore has similar problems regarding disposal.

In view of such circumstances, it is considered that the research of lead-free piezoelectric materials considering environment is urgent and essential, and the research and development of lead-free piezoelectric ceramics having high performance comparable to the performance of current PZT-based piezoelectric ceramics attracts worldwide interest.

In recent years, for niobate-based $KNbO_3$—$NaNbO_3$—$LiNbO_3$-based ceramics among the lead-free piezoelectric ceramics, compositions having relatively high piezoelectric properties and production methods have been thought out, and one having a Curie temperature of about 250° C. and a piezoelectric constant d33 of about 400 pm/V, which are close to practicable performance, has also been obtained (Non Patent Literature 1).

Patent Literature 1 discloses a crystal-oriented ceramic composed of a polycrystal comprising, as a main phase, a first perovskite type pentavalent metal acid alkali compound being an isotropic perovskite type compound represented by general formula: $ABO_3$ in which the main component of the A-site element is K and/or Na, and the main component of the B-site element is Nb, Sb and/or Ta, wherein a particular crystal face of each grain constituting the polycrystal is oriented, the crystal-oriented ceramic being obtained by mixing a plate-like powder, such as $NaNbO_3$, in which a particular crystal face is oriented, and a reaction raw material, sheet-forming the mixture obtained by mixing, laminating a plurality of the obtained sheets to make a laminate, then performing the rolling, degreasing, and isostatic pressing (CIP) treatments of the laminate, and heating the laminate in oxygen; and a method for producing the same.

In addition, Patent Literature 2 discloses a production method in which Patent Literature 1 is further improved, the CIP treatment is omitted, and mass productivity is also considered.

On the other hand, Patent Literature 3 discloses, as a method for obtaining a plate-like metal titanate compound, a production method of preparing titanium oxide, an oxide, hydroxide, or salt of an A element (at least one element of the group consisting of Na, K, Rb, and Cs), and an oxide, hydroxide, or salt of an M element (at least one element of the group consisting of Li, Mg, Co, Ni, Zn, Mn(III), and Fe(III)) in an aqueous medium at a reaction temperature of 120 to 300° C. by a hydrothermal synthesis method, reacting the obtained layer-like titanate with an acid to convert it into a plate-like titanate hydrate, and further reacting the plate-like titanate hydrate with an oxide, hydroxide, or salt of at least one of the group consisting of Mg, Ca, Sr, Ba, and Pb in an aqueous medium under heating.

CITATION LIST

Patent Literature

[Patent Literature 1] Japanese Patent Laid-Open No. 2003-12373
[Patent Literature 2] Japanese Patent Laid-Open No. 2008-74693
[Patent Literature 3] Japanese Patent Laid-Open No. 2007-22857

Non Patent Literature

[Non Patent Literature 1] Y. Saito, H. Takao, T. Tani, T. Nonoyama, K. Takatori, T. Homma, T. Nagaya, and M. Nakamura, "Lead-free piezoceramics", Nature, 432, Nov. 4, 84-87 (2004)

SUMMARY OF INVENTION

Technical Problem

In the techniques of the above Patent Literatures 1 and 2, plate-like crystals oriented in a particular face are made through a Bi compound. In the reaction, a large amount of NaCl molten salt is used. Therefore, in order to remove NaCl and Bi after the reaction from the product, the step of washing with a large amount of water or an acid is included. Specifically, first, a $Bi_2O_3$ powder, a $NaHCO_3$ powder, a $Nb_2O_5$ powder, and a $Ta_2O_5$ powder are weighed in a stoichiometric proportion so as to obtain $Bi_{2.5}Na_{3.5}(Nb_{0.93}Ta_{0.07})_5O_{18}$, and wet-mixed. Then, 80 parts by weight of NaCl as a flux is added to 100 parts by weight of the obtained mixture, and they are dry-mixed. Next, the obtained mixture is heated in a platinum crucible to perform the synthesis of $Bi_{2.5}Na_{3.5}(Nb_{0.93}Ta_{0.07})_5O_{18}$. Then, the reaction product is washed with hot water to remove the flux to obtain a $Bi_{2.5}Na_{3.5}(Nb_{0.93}Ta_{0.07})_5O_{18}$ powder. This $Bi_{2.5}Na_{3.5}(Nb_{0.93}Ta_{0.07})_5O_{18}$ powder is a plate-like powder in which the {001} plane is an orientation plane (maximum plane).

Next, the $Bi_{2.5}Na_{3.5}(Nb_{0.93}Ta_{0.07})_5O_{18}$ powder is pulverized, and a $NaHCO_3$ powder is add to the $Bi_{2.5}Na_{3.5}(Nb_{0.93}Ta_{0.07})_5O_{18}$ powder, and they are dry-mixed. 80 parts by weight of NaCl as a flux is added to 100 parts by weight of the obtained mixture, and they are dry-mixed. Next, the mixture is heated in a platinum crucible at a temperature of 950° C. for 8 hours to synthesize $Na(Nb_{0.93}Ta_{0.07})O_3$.

In addition to $Na(Nb_{0.93}Ta_{0.07})O_3$, $Bi_2O_3$ is included in this reaction product, and therefore, it is necessary to remove $Bi_2O_3$ after the reaction product is washed with hot water to remove the flux. In other words, first, the reaction product after the flux is removed is stirred in 2.5 N $HNO_3$ for 4 hours to dissolve $Bi_2O_3$ produced as an excess component. Then, this solution is filtered to separate the $Na(Nb_{0.93}Ta_{0.07})O_3$ powder, and the $Na(Nb_{0.93}Ta_{0.07})O_3$ powder is washed with ion-exchange water at a temperature of 80° C. In this manner, an anisotropically shaped powder composed of a Na(Nb$_{0.93}$Ta$_{0.07}$)O$_3$ powder is obtained.

As described above, a long step is required to obtain plate-like crystals, and particularly, a large amount of substances should be removed in the washing step, and the production step is complicated.

In addition, the technique of Patent Literature 3 concerns a method for producing a plate-like powder using a hydrothermal synthesis method. However, this method requires a relatively long step of first obtaining layer-like titanate, then reacting the layer-like titanate with an acid to convert it into a plate-like titanate hydrate, and further heating and reacting the plate-like titanate hydrate in barium hydroxide. Here, it is described that the reaction time with the hydrothermal synthesis is 5 to 50 hours, but, according to Examples, a reaction time of 20 hours is required. In this manner, even when hydrothermal synthesis is used, long reaction time is required.

As described above, in the conventional art literatures, the washing step is complicated and takes time, which is still insufficient for industrial production.

Therefore, it is one object of the present invention to provide an anisotropically shaped powder in which a particular crystal face is oriented, which is preferred as plate-like crystals used in the process of producing crystal-oriented ceramics, such as niobate-based KNbO$_3$—NaNbO$_3$—LiNbO$_3$-based and barium titanate-based crystal-oriented ceramics, and a method for producing the same.

Solution to Problem

The present invention provides a method for producing an anisotropically shaped powder oriented in a particular crystal face, directly from K and Na sources, rather than through a Bi compound as in the above related art.

A method for producing an anisotropically shaped powder according to one aspect of the present invention comprises the steps of adding an oxide powder, such as Nb$_2$O$_5$, and a surfactant to an aqueous solution of alkali hydroxides, such as NaOH and KOH, to perform hydrothermal synthesis; washing a product obtained after reaction, with an organic solvent; and firing the product after the washing at 170° C. to 700° C.

It is desired that Nb$_2$O$_5$, one of oxide powders used in the above production method, has an average particle size of 100 nm or more and less than 2000 nm and has an orthorhombic crystal structure.

In addition, the anisotropically shaped powder of the present invention obtained by the above production method has a ratio of an average particle length in a major axis direction to an average particle length in a thickness direction in the range of 2 to 20 and has a pseudo-cubic perovskite structure in which a crystal face is oriented in a (100) plane.

Advantageous Effects of Invention

The present invention provides a method suitable for mass production for producing an anisotropically shaped powder, wherein plate-like crystals can be obtained more easily than the method through a Bi compound and other methods, the plate-like crystals being used in producing a crystal-oriented ceramic with a particular crystal face oriented; and the anisotropically shaped powder.

DESCRIPTION OF EMBODIMENT

Figure 1:
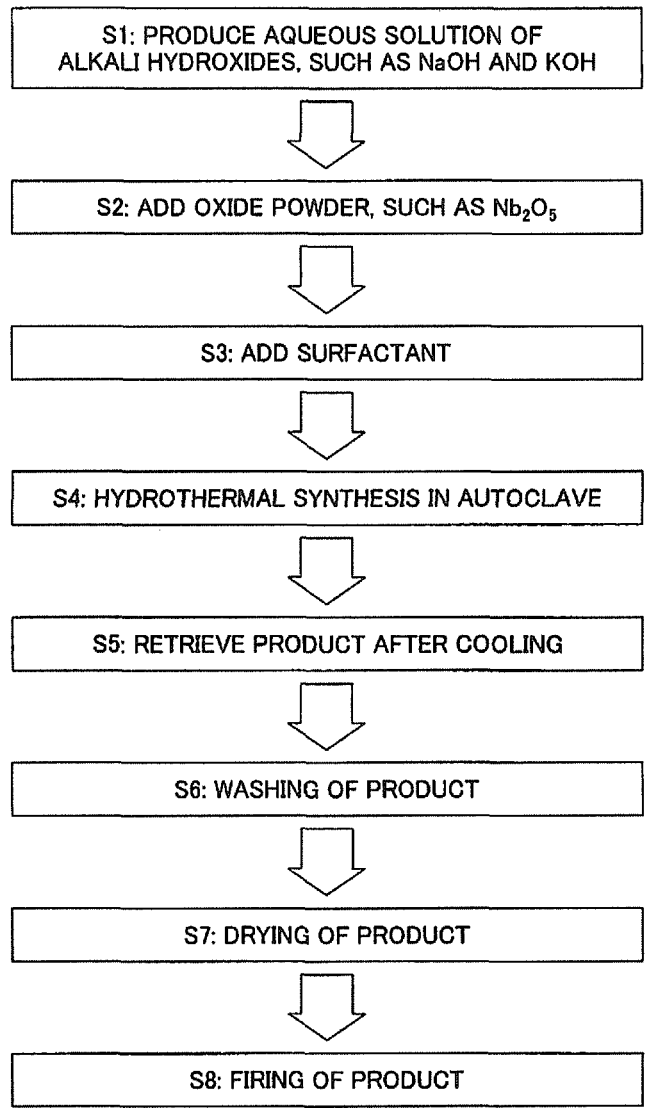
FIG. 1 is an explanatory diagram showing an example of a method for producing an anisotropically shaped powder according to an embodiment of the present invention.

An embodiment of the present invention will be described. A method for producing an anisotropically shaped powder according to this embodiment is as illustrated in FIG. 1. This anisotropically shaped powder refers to flat particles having such major and minor axes that the dimension in the longitudinal direction is longer than the dimensions in the width direction and the thickness direction, and will be referred to as plate-like crystals below. In this process in FIG. 1, first, an aqueous alkali hydroxide solution is produced (S1). Here, the aqueous alkali hydroxide solution is obtained, for example, by dissolving potassium hydroxide (KOH), sodium hydroxide (NaOH), or both of these in ion-exchange water. The K/Na ratio when both of KOH and NaOH are used is in the range of 1 to 10.

This is due to the following reason. K and Na are different in reactivity, and Na reacts more easily with niobium oxide (Nb$_2$O$_5$), which is added later, than K does. In addition, generally, as a lead-free piezoelectric material comprising K, Na, and Nb, K$_{0.5}$Na$_{0.5}$NbO$_3$ is known, and composition improvements based on this composition are widely performed. Therefore, also here, plate-like crystals are made centered on the composition system. At this time, as the K/Na ratio decreases, $NaNbO_3$ in the composition becomes rich. On the other hand, as this K/Na ratio increases, $KNbO_3$ in the composition of the reaction product becomes rich. As a result of experiment, it has been found that in order to obtain a composition near $K_{0.5}Na_{0.5}NbO_3$, the K/Na ratio is desirably in the range of 1 to 10, particularly 1.5 to 3.5. In addition, the solution concentration when this composition near $K_{3.5}Na_{0.5}NbO_3$ is obtained is desirably KOH+NaOH=1 to 15 mol/l, further desirably 1.3 to 10 mol/l. When the solution concentration is smaller than 1 mol/l, the efficiency of the reaction is poor, and unreacted niobium oxide remains. In addition, when the concentration is high, the reaction proceeds well, but the amount of excess alkali components to be washed increases, and a large amount of an organic solvent used for washing is required, which leads to subsequent work burdens and an increase in cost.

This embodiment is not limited to the above numerical value range, and K/Na may be less than 1. In other words, this embodiment does not limit that the K/Na ratio should be in the range of 1 to 10.

Next, an oxide powder is placed in the aqueous alkali hydroxide solution (here, a KOH+NaOH solution) produced as described above, and they are stirred and mixed (S2). Here, the oxide powder is, for example, $Nb_2O_5$, $TiO_2$, or $Ta_2O_5$ having a median radius of 100 nm or more and less than 2000 nm (0.1 μm or more and less than 2 μm). As the particle size of this powder becomes smaller, the reactivity becomes better. But, when the particle size is less than 100 nm, a problem is that the powder aggregates easily, and it is difficult to adjust the particle size, and therefore, a commercial pulverizer with mass productivity cannot be used. In addition, when the particle size is 2000 nm or more, a problem is that plate-like crystals are not easily formed.

Figure 2:
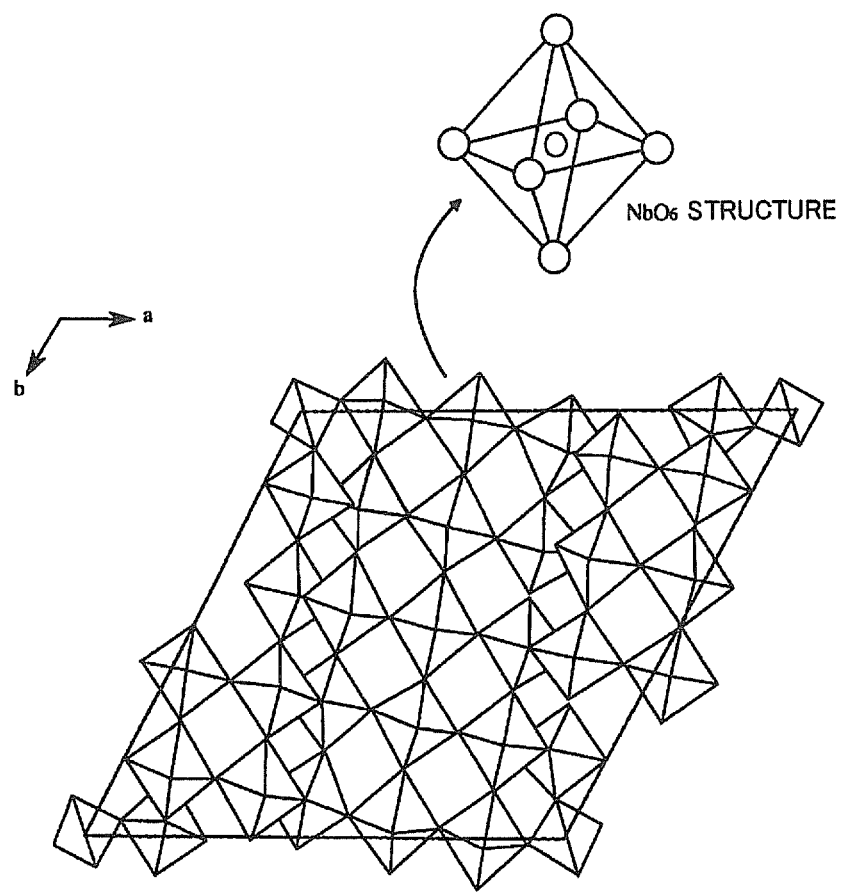
FIG. 2 is a schematic diagram showing the basic structure and crystal structure of monoclinic Nb$_2$O$_5$.

In addition, for $Nb_2O_5$, the crystal structure may be an orthorhombic system without oxygen defects because when the crystal structure is a monoclinic system with oxygen defects, plate-like crystals may be less easily formed compared with the orthorhombic system. This is considered to be due to the following reason. For $Nb_2O_5$, two types of crystal systems, a monoclinic system and an orthorhombic system as described above, are known. Monoclinic $Nb_2O_5$ is shown in FIG. 2. In the monoclinic system, $NbO_6$ basic structures in which oxygen is located at the apexes of a regular octahedron and Nb is located at its center are connected in the form of sharing their apexes, to form the entire crystal structure. Therefore, the actual chemical formula is not $Nb_2O_5$ and is $Nb_2O_{5-\delta}$ and is slightly short of oxygen. It is considered that when this monoclinic $Nb_2O_{5-\delta}$ reacts with alkali components to produce a $K_4Na_3Nb_6O_{19}$-$9H_2O$ crystal structure described below, first, the bonds of portions where the apexes are shared are broken, and the reaction proceeds. As a result, shape anisotropy is not seen in the produced particles compared with the orthorhombic system.

Figure 3:
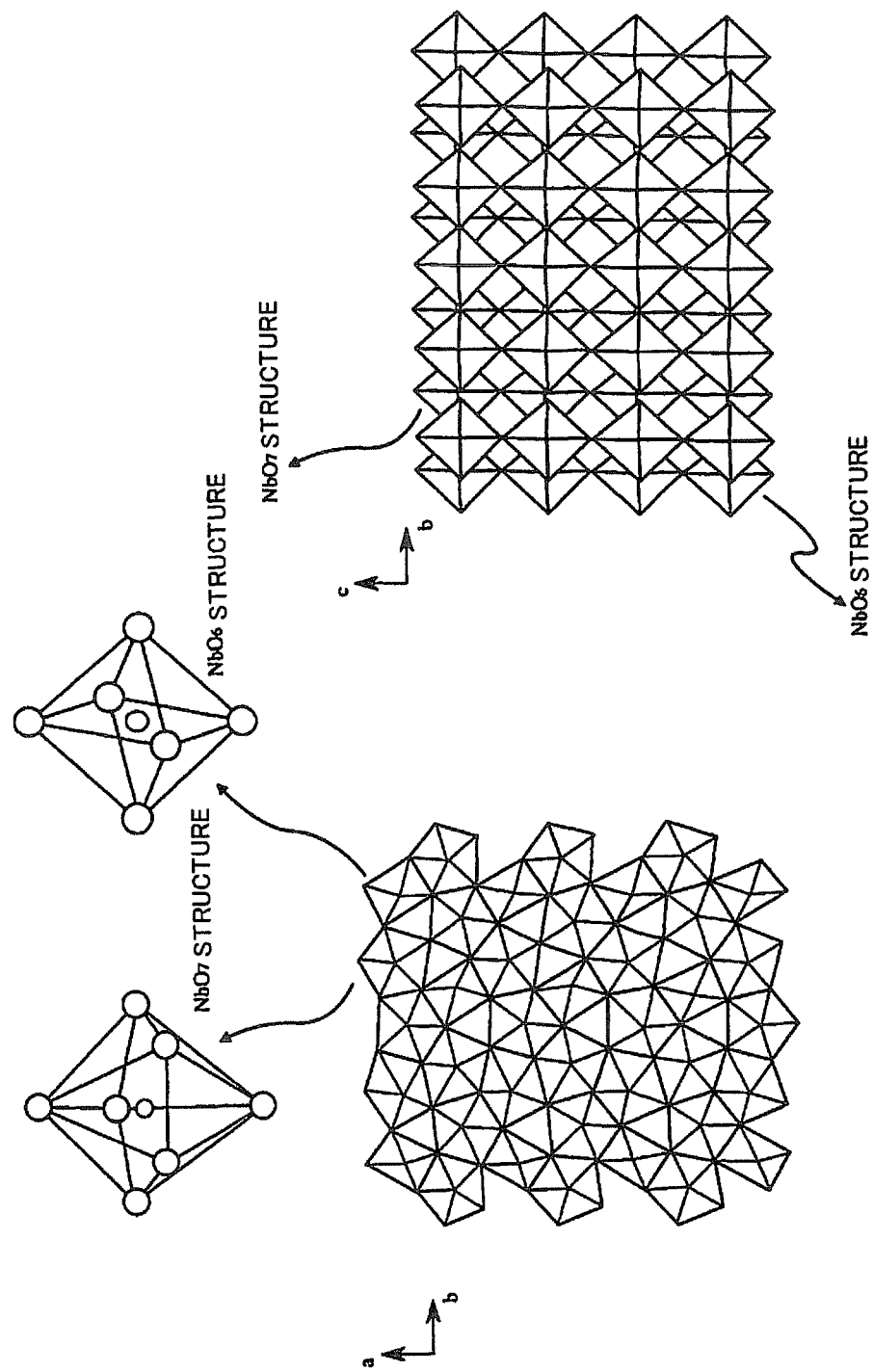
FIG. 3 is a schematic diagram showing the basic structure and crystal structure of orthorhombic Nb$_2$O$_5$.

On the other hand, in orthorhombic $Nb_2O_5$ shown in FIG. 3, a combination of two types, the above $NbO_6$ basic structure of a regular octahedron and a $NbO_7$ basic structure of a regular decahedron in which oxygen is located at the apexes and Nb is located at the center as well, forms a crystal structure. As is seen from FIG. 3, this structure has portions where not only the apexes but also the sides are shared in a plane, and it is considered that the portions where the sides are shared have strong bond strength compared with the sharing of only the apexes. Therefore, it is considered that bonds break easily between layers where only the apexes are shared, and due to this, the product easily forms an anisotropic shape, that is, a plate-like shape.

For example, when the K/Na ratio is 1.5, the amount of the oxide powder (here, $Nb_2O_5$) used with respect to the aqueous alkali hydroxide solution (here, the KOH+NaOH solution) is preferably about 1 wt % to 15 wt % because it has been confirmed from experiment that when the amount of the oxide powder used is less than 1 wt %, the production efficiency of the reaction product is poor, and when the amount of the oxide powder used is more than 15 wt %, the oxide powder does not react completely, and the unreacted oxide powder remains, which is not efficient. In terms of production efficiency, more preferably, for example, when the K/Na ratio is 1.5, the amount of the oxide powder (here, $Nb_2O_5$) used, with respect to the aqueous alkali hydroxide solution (here, the KOH+NaOH solution), is 2 wt % to 10 wt %.

Further, a surfactant, such as SDBS (sodium dodecylbenzenesulfonate), is added thereto (S3). When SDBS is used as this surfactant, and $Nb_2O_5$ is used as the oxide powder, the amount of SDBS added is in the range of 0.1 wt % to 5 wt % with respect to $Nb_2O_5$. When the amount of SDBS added is less than 0.1 wt %, the particle size of the product after the reaction is large, and plate-like crystals are not easily formed. In addition, when the amount of SDBS added is more than 5 wt %, the plate-like crystals are too fine. According to experiment, a more preferred amount of SDBS added is 0.5 wt % to 3 wt % with respect to $Nb_2O_5$. In practice, the amount of SDBS added should be, for example, 0.8 wt %.

The mixed solution obtained by adding the surfactant is placed in a Teflon (registered trademark)-lined autoclave container and sealed, and heated at a preset temperature for a predetermined time to perform hydrothermal synthesis (S4). This heating temperature is 160° C. to 250° C. When the heating temperature is lower than 160° C., the reaction is incomplete, and $Nb_2O_5$ remains unreacted. In addition, 250° C. is a limit because the heat resistance of the Teflon-lined autoclave is considered. The heating time in the treatment S4 is about 2 to 8 hours. When the heating time is shorter than 2 hours, the reaction is insufficient, and unreacted $Nb_2O_5$ remains. In addition, the degree of progress of the reaction changes in a logarithmic function manner. At an early stage, the reaction is significant, but as time elapses, the reaction subsides, and even if the time is extended, a little change occurs. Therefore, the heating time should be set considering productivity, with 2 hours as the lower limit and the upper limit not particularly provided. For example, the heating temperature is 200° C., and the heating time is 4 hours.

Figure 4:
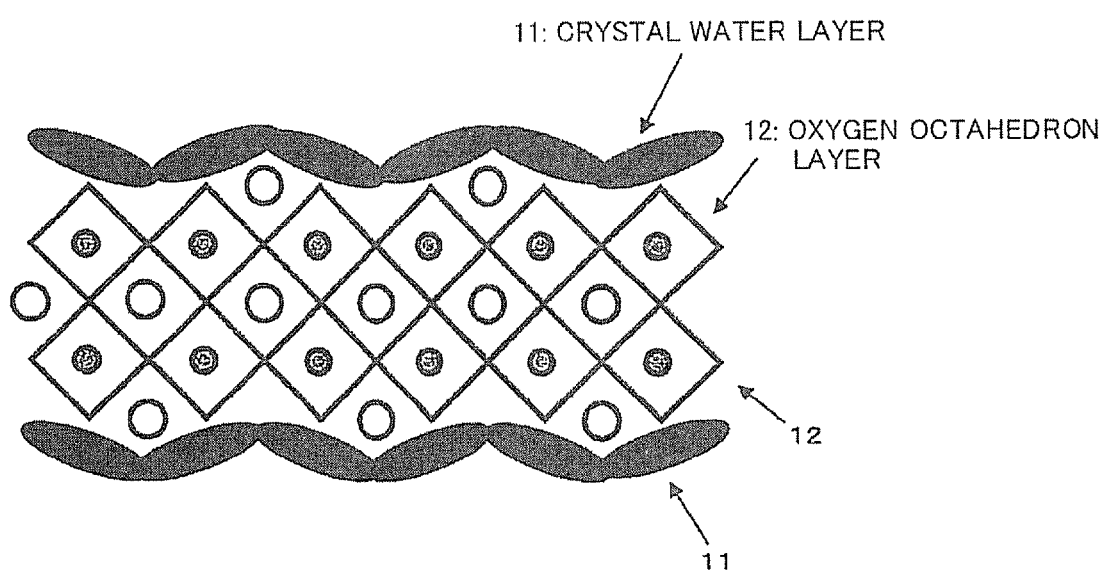
FIG. 4 is a schematic diagram showing the estimated structure of K$_4$Na$_3$Nb$_6$O$_{19}$-9H$_2$O.

When the surfactant is not used at this stage, first, fine particles of $K_4Na_4Nb_6O_{19}$-$9H_2O$ (hereinafter referred to as "446") are produced. The structure of this 446 crystal is a structure in which both surfaces of two oxygen octahedron layers 12 are sandwiched between one crystal water layer 11 and one crystal water layer 11 as shown in FIG. 4. Due to this crystal structure, in the 446 crystal powder, the growth rate in the direction of the surface of the crystal water is slightly slower than in the direction parallel to the surface of the crystal water, and the 446 crystal powder grows into a flat spherical (go stone-like) powder as in an SEM photograph shown in FIG. 5.

However, in this flat spherical powder, the diameter-to-thickness ratio is not a value required for making oriented ceramics. When the synthesis temperature is higher than 200° C., or the synthesis time is longer than 8 hours, the 446 powder having high potential disappears gradually, the synthesis reaction proceeds further, and the powder changes into $(K,Na)NbO_3$ (hereinafter referred to as "112") fine particles having the most stable perovskite structure. This 112 crystal is a perovskite ferroelectric and has spontaneous polarization, and therefore is charged and has the property of aggregating easily. When the 112 particles aggregate to grow into crystals of several hundred nanometers or more, they finally form cubes due to a large difference in the surface energy of crystal faces as well as form large particles due to aggregation. Therefore, a particle shape unsuitable for orientation is formed.

Figure 6:
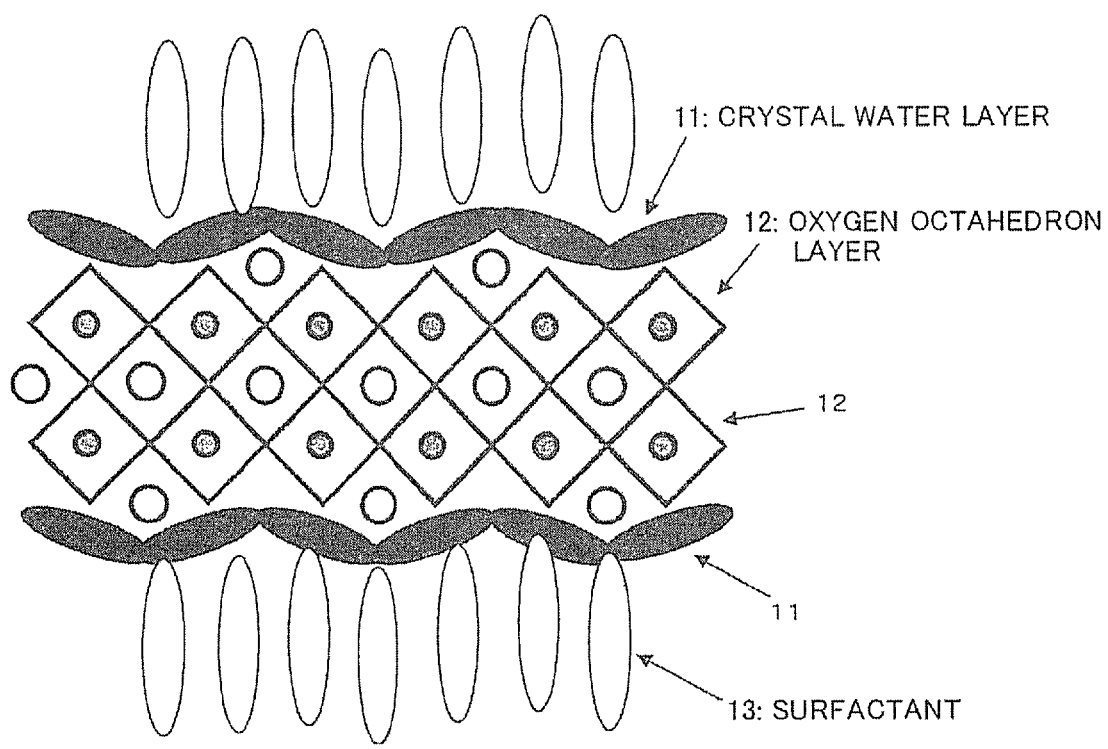
FIG. 6 is a schematic diagram showing the estimated structure of K$_4$Na$_3$Nb$_6$O$_{19}$-9H$_2$O when a surfactant is used.

On the other hand, also when the surfactant is used, first, 446 crystals are formed. However, a surfactant (including an anionic type, a cationic type, a nonionic type, and an amphoteric type) 13 adheres to the crystal water layers 11 or the oxygen octahedron layers 12 of the 446 crystal particles and covers these surfaces as shown in FIG. 6, and therefore, the surfactant 13 inhibits the contact of these surfaces with a component required for crystal growth. Therefore, the growth rate of the 446 crystals in the crystal water surface 11 direction is more strongly controlled than in the case where the surfactant is not used, and the formation of thinner plate-like crystals is promoted compared with the case where the surfactant is not used. In addition, the surfactant also plays the role of dispersing the 446 crystals.

Further, as the outline is illustrated in FIG. 6, the surfactant 13 adheres to the crystal water layers 11 or the oxygen octahedron layers 12 of the 446 particles, and thus, the potential of the 446 crystals decreases. Even if the synthesis temperature is higher than 200° C., or the synthesis time is 8 hours or more, the 446 particles only grow large and do not change into a perovskite structure. Therefore, the size and thickness-to-diameter ratio of the formed 446 particles can be controlled by the adjustment of the type of the surfactant, the amount of the surfactant used, synthesis temperature, and synthesis time, and, for example, plate-like crystals, which are plate-like templates suitable for making potassium sodium niobate-based high-performance lead-free piezoelectric-oriented ceramics, can be made. For example, at 190° C. for 4 hours, plate-like crystals having a diameter of about 4 microns and a thickness of about 250 nanometers (diameter-thickness ratio 16 to 1) are made.

As the surfactant, SDBS is used in the above example, but the surfactant should be a surfactant that has the effect of adhering to the above crystal water layer or oxygen octahedron layer and inhibiting contact between the crystal face and a reactant. Instead of SDBS, SH (sodium hexametaphosphate) as well as SDS (sodium dodecyl sulfate), LIDS (lithium dodecyl sulfonate), HDBS (dodecylbenzenesulfonic acid), and the like may be used as an anionic surfactant. In addition, CTAC (hexadecyltrimethylammonium chloride), DTAC (dodecyltrimethylammonium chloride), DDAC (didodecyldimethylammonium chloride), DODAC (dioctadecyldimethylammonium chloride), and the like may be used as a cationic surfactant. Further, PEG (polyethylene glycol) as well as PVA (polyvinyl alcohol), PA (polyacrylamide), AGE (alkyl monoglyceryl ether), and the like may be used as a nonionic surfactant. In addition, LDAB (lauryldimethylaminoacetic acid betaine), ADAO (alkyldimethylamine oxide), ACB (alkylcarboxybetaine), and the like may be used as an amphoteric surfactant.

Then, cooling is performed, and after the cooling, the container is opened, and the reaction product is retrieved (S5). Then, the reaction product is filtered, and then, in order to remove the alkali components from the reaction product, the reaction product is washed with an organic solvent, such as ethanol or methanol, until it becomes neutral (S6). It has been found that at this time, in the case of washing using pure water, part of the reaction product is dissolved in water to be in the form of a suspension. Therefore, in this embodiment, a washing liquid that can wash the alkali components and does not dissolve part of the product is used. Considering the aspects of the ease of handling, and availability, organic solvents, such as ethanol and methanol, are preferred, and further considering cost, methanol is preferred.

Figure 7:
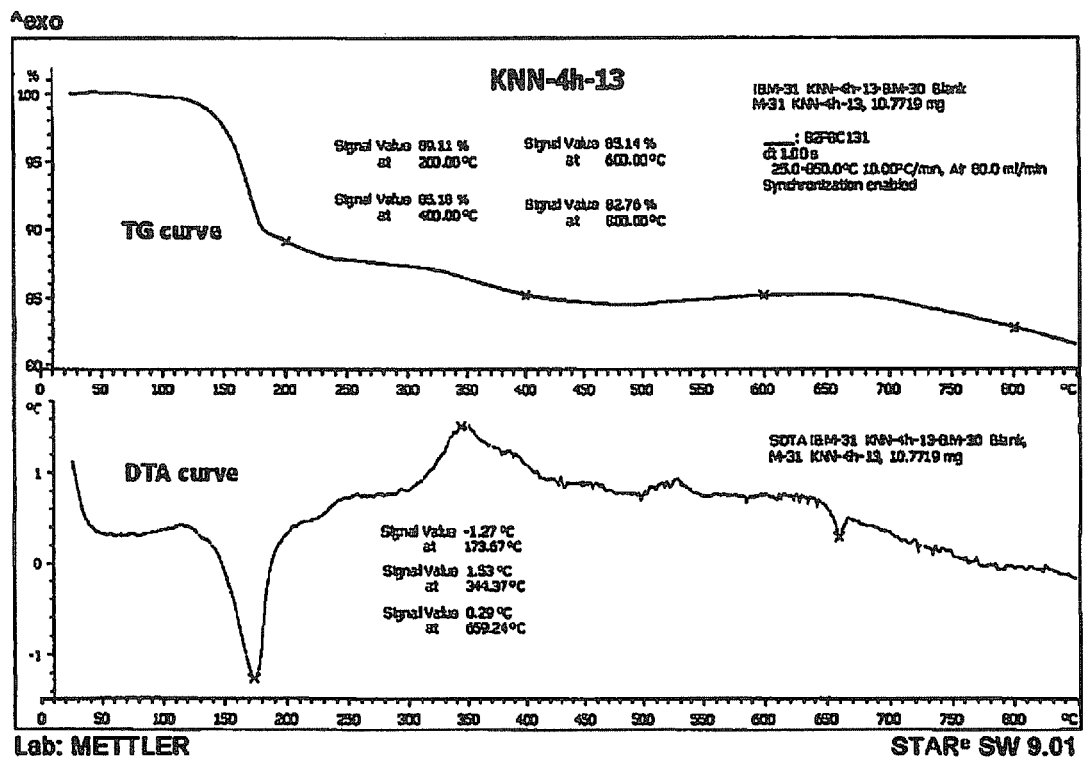
FIG. 7 is an explanatory diagram showing the thermogravimetric analysis results of K$_4$Na$_3$Nb$_6$O$_{19}$-9H$_2$O.

Next, after the washing is completed, the reaction product is dried at about 100° C. to 200° C. (S7). Then, the reaction product is fired at 170° C. to 700° C. (S8). The drying step may be combined with the step of S8 to omit the step of S7. By the firing in this step S8, the crystal water present in the crystals is dehydrated to obtain plate-like crystals. The firing atmosphere is not particularly limited, and firing may be performed in the air combined with the previous drying step. The thermogravimetric analysis results of the plate-like crystals obtained in step S6 are shown in FIG. 7. In FIG. 7, the upper column shows the thermogravimetric analysis. Mass ratio is plotted on the vertical axis, and temperature is plotted on the horizontal axis to show changes in mass ratio depending on heating. Here, when the plate-like crystals are heated to a temperature of 170° C., weight change is noted. It is considered that this is because the crystal water is eliminated from the crystals at this temperature. From this result, it can be said that the effect of dehydrating the crystal water is not obtained unless the firing temperature is 170° C. or higher. In addition, the lower column in FIG. 7 shows differential thermal analysis results. From this graph in the lower column in FIG. 7, endothermic action is seen at 170° C., and it is presumed that a change in crystal structure occurs at 300° C. to 350° C.

Figure 8A:
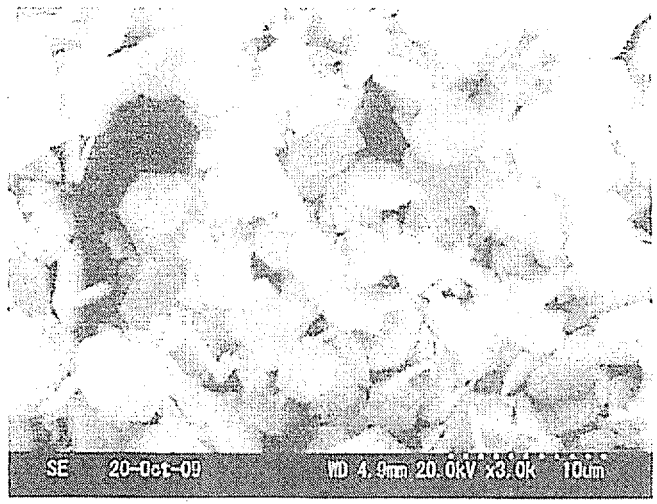
FIG. 8 is an explanatory diagram showing examples of SEM images when plate-like crystals are fired at temperatures.
Figure 8B:
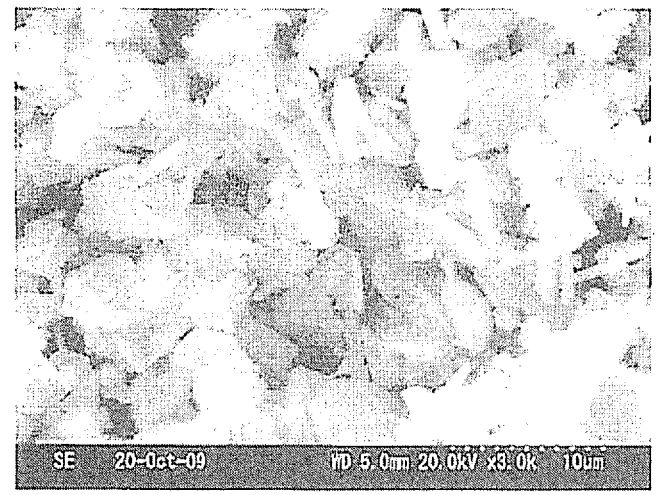
Figure 8C:
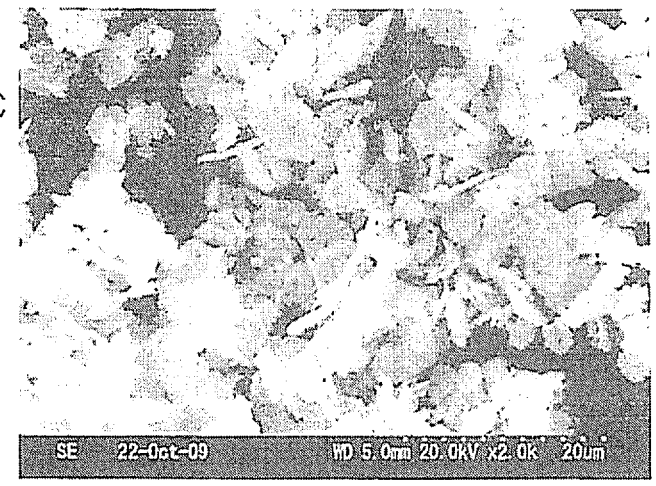
Figure 9:
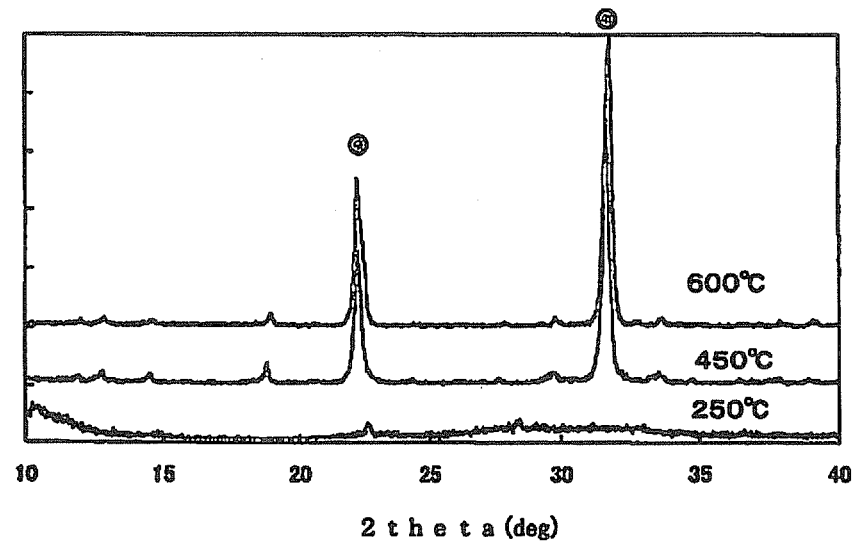
FIG. 9 is an explanatory diagram showing X-ray diffraction patterns when plate-like crystals are fired at temperatures.

Next, SEM images after the plate-like crystals obtained in step S6 are fired and dehydrated at 250° C., 450° C., and 600° C. for 1.5 hours are shown in FIG. 8. It is seen that a plate-like shape is maintained at all temperatures. In addition, the results of X-ray diffraction patterns of the plate-like crystals in these examples are shown in FIG. 9. According to FIG. 9, in the plate-like crystals with which the firing temperature is 450° C. and 600° C., $2\theta$ shows peaks around 22° and around 32°, and it is seen that the plate-like crystals has a perovskite structure. It has been confirmed that when the firing temperature is higher than 700° C., the plate-like crystals crack, and the particles are sintered and do not have a plate-like shape in some cases. Therefore, it can be said that the firing temperature is preferably 350° C. or higher and 700° C. or lower, particularly 450° C. to 600° C.

Figure 10:
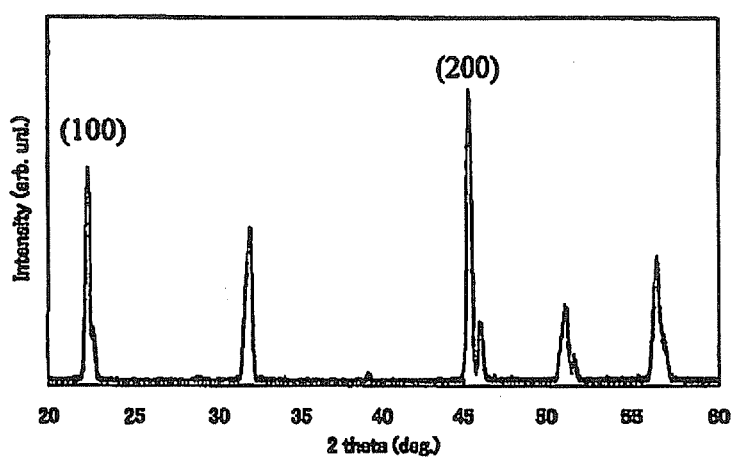
FIG. 10 is an explanatory diagram showing an example of an X-ray diffraction pattern when plate-like crystals are sheet-formed and fired.

Next, the obtained plate-like crystals are sheet-formed. An X-ray diffraction pattern when 10 of the sheets are stacked to form a laminate, and then the laminate is CIP (Cold Isostatic Pressing)-formed and then fired at 950° C. is shown in FIG. 10. From the result shown in FIG. 10, it has been observed that this laminate has a pseudo-cubic perovskite structure, and the peak intensity in the (100) plane and a (200) plane, which is its secondary reflection, is strong.

In this manner, in this embodiment, it is possible to obtain an anisotropically shaped powder (plate-like crystals) having a ratio of an average particle length in the major axis direction to an average particle length in the thickness direction in the range of 2 to 20 and composed of plate-like crystals having a pseudo-cubic perovskite structure, in which the major faces (front and back faces having a relatively large area, hereinafter referred to as crystal faces) of the plate-like crystal are oriented in the (100) plane.

Further, plate-like crystals oriented in a particular crystal face, obtained by the production method in this embodiment, are mixed with a reaction raw material, such as potassium niobate, barium titanate, or strontium titanate, and the composition is adjusted. Then, the mixture is formed into a sheet shape as in the above, the sheets are laminated to form a laminate, and the laminate is fired. The ceramic sintered body obtained by this firing is a piezoelectric ceramic having crystal orientation and having high piezoelectric constant properties at a high Curie temperature. The sintering at this time should be performed at a temperature of 900° C. to 1300° C. for only 2 hours to 10 hours.

EXAMPLES

Example 1

Next, an example in which an anisotropically shaped powder is made by the method for producing an anisotropically shaped powder in this embodiment will be described. First, KOH and NaOH were mixed in the proportion of K/Na=1.5, and the mixture was weighed so as to be KOH+NaOH=6 mol/l, and then dissolved in ion-exchange water.

Figure 11A:
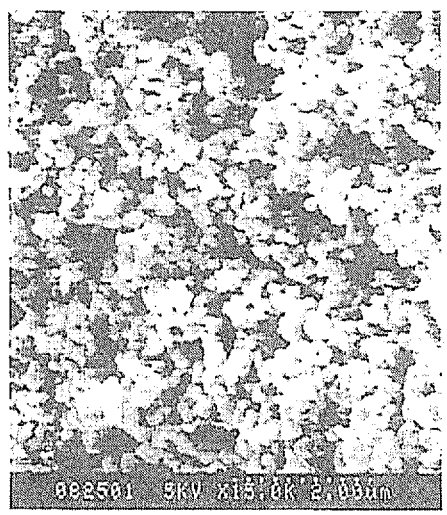
FIG. 11 is an explanatory diagram showing an example of an SEM image and X-ray diffraction pattern of niobium oxide according to an Example of the present invention.
Figure 11B:
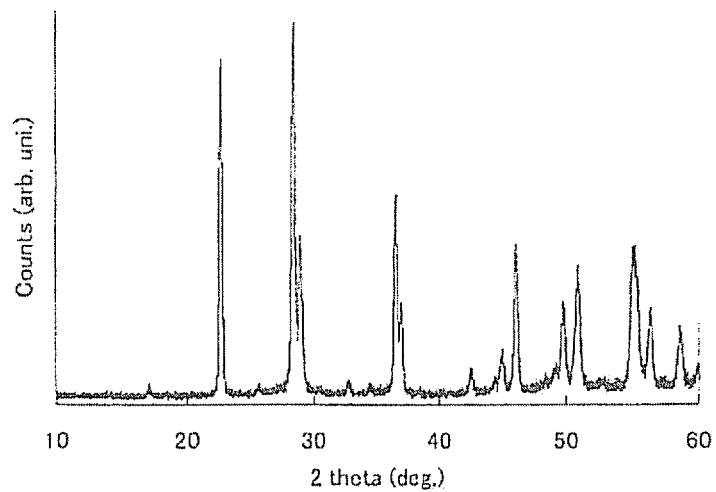

Next, 1.25 g (2.2 wt %) of a $Nb_2O_5$ powder having a median radius of 200 nm and having an orthorhombic structure was weighed and added to 40 ml of the previously made KOH+NaOH solution. In addition, 0.8 wt % of a surfactant SDBS with respect to the $Nb_2O_5$ powder was further added and stirred. A particle SEM image (acceleration voltage 5 kV, 15000×) and an X-ray diffraction pattern of the $Nb_2O_5$ powder used here are shown in FIGS. 11(a) and 11(b).

The thus obtained mixed solution was placed in a Teflon-lined autoclave container and sealed, and heated at 200° C. for a predetermined time. After cooling, the container was opened, and the reaction product was removed. The amount of the reaction product obtained here was 2.2 g. The reaction product was washed with ethanol several times and dried, and the powder was retrieved.

Next, after the washing was completed, the reaction product was dried at 150° C., and then fired at 450° C.

Figure 12:
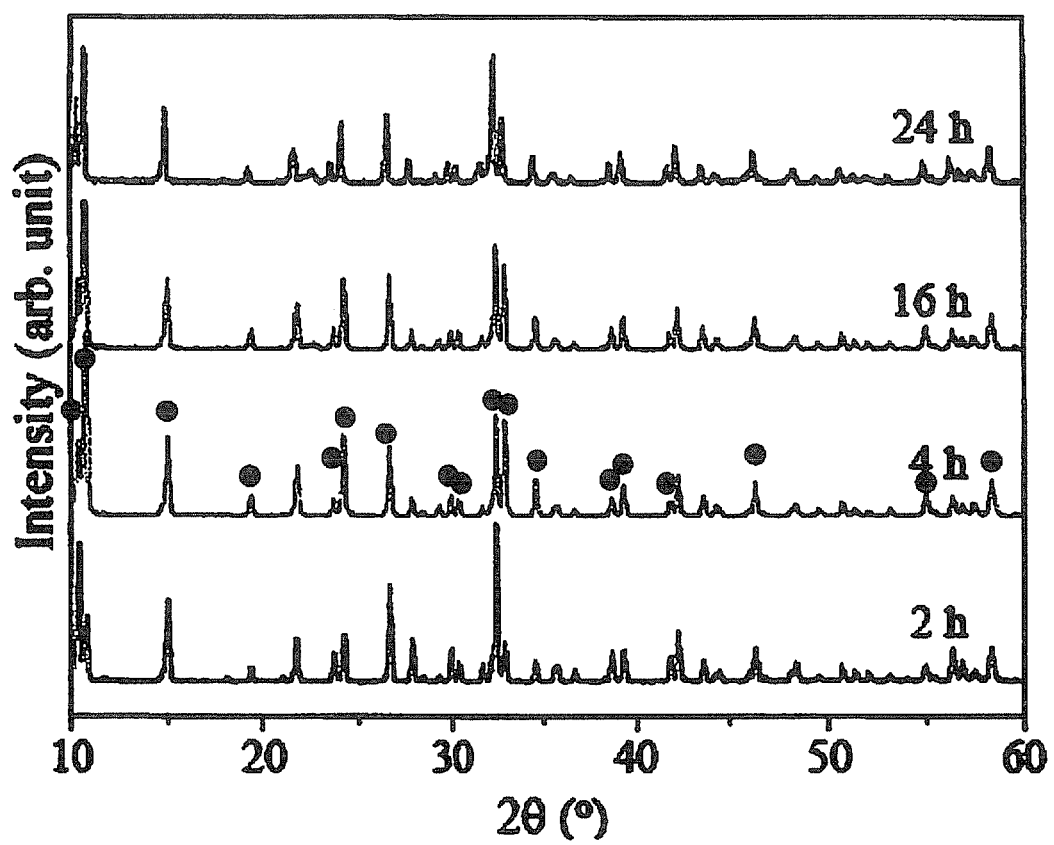
FIG. 12 is an explanatory diagram showing examples of X-ray diffraction patterns of anisotropically shaped powders obtained in an Example of the present invention.

FIG. 12 is an explanatory diagram showing X-ray diffraction patterns of powders obtained when the heating time in the autoclave container was 2 hours, 4hours, 16 hours, and 24 hours. As shown in FIG. 12, even if the heating time was changed, there was substantially no change in the X-ray diffraction pattern.

Figure 13:
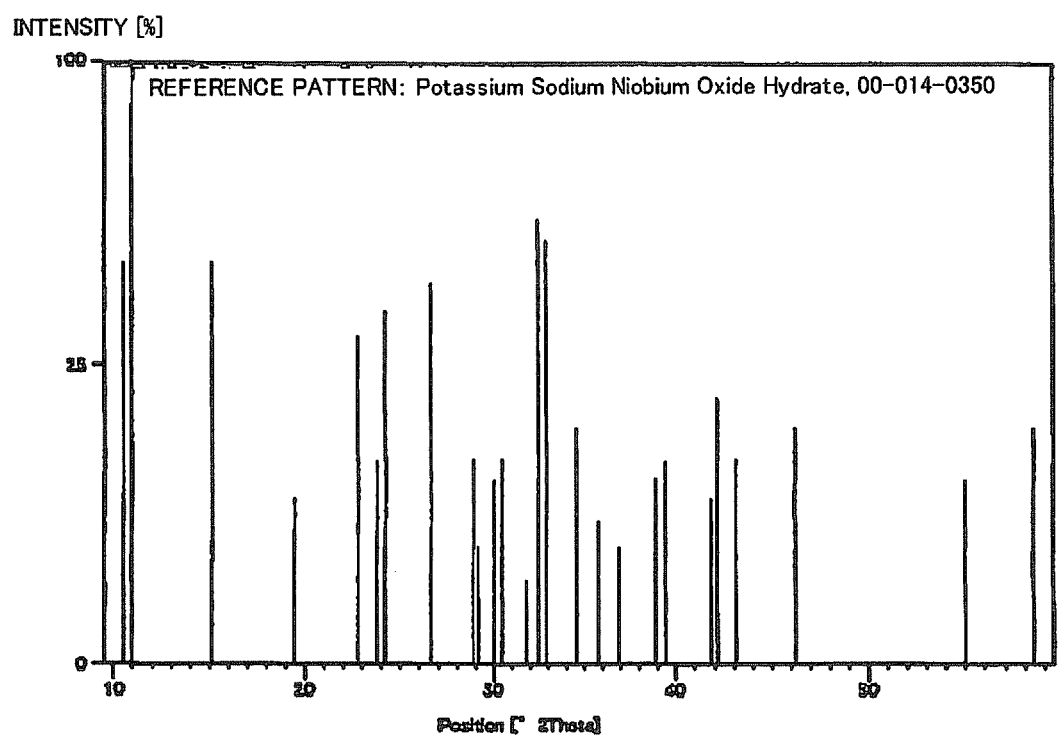
FIG. 13 is an explanatory diagram showing an X-ray diffraction pattern for K$_4$Na$_3$Nb$_6$O$_{19}$-9H$_2$O (JCPDS card No. 14-0360).

In addition, as a reference pattern, an X-ray diffraction pattern of $K_4Na_3Nb_6O_{19}$-$9H_2O$ (PDF card #14-0360) is shown in FIG. 13. In the X-ray diffraction pattern of the substance obtained by the production method in this embodiment (the example with 4-hour heating), shown in FIG. 12, peaks matching those in the reference pattern in FIG. 13 are marked with black circles. The X-ray diffraction pattern of the substance obtained by the production method in this embodiment, shown in FIG. 12, matched the X-ray diffraction pattern of $K_4Na_3Nb_6O_{19}$-$9H_2O$ shown in FIG. 13 as the reference pattern, in many portions, and the main component was presumed to be $K_4Na_3Nb_6O_{19}$-$9H_2O$.

Figure 14:
FIG. 14 is an explanatory diagram showing an example of an SEM image of an anisotropically shaped powder according to an Example of the present invention.

In addition, FIG. 14 shows a scanning electron microscope (SEM) image (SEM: manufactured by Hitachi, Ltd., acceleration voltage: 20 kV, magnification: 10000×) of the powder obtained when the heating time in hydrothermal synthesis was 4 hours, which is the substance made by the production method in this embodiment.

From the SEM image, it was observed that the obtained powder had a major axis of 0.5 to 8 μm and a thickness of 0.05 to 0.5 μm and an average major axis of 2 μm and an average thickness of 0.15 μm (150 nm). Here, in the case of the powders with long heating time, the major axis was larger, and the particle length and the thickness can be adjusted by heating time. In addition, it was found that the particle length was increased by decreasing the amount of the surfactant used, and the particle length and the thickness can also be adjusted by the surfactant. From the above, the powder had a ratio of an average particle length in the major axis direction to an average particle length in the thickness direction in the range of 2 to 20.

In addition, the obtained plate-like crystals were fired and dehydrated at 450° C. and then sheet-formed followed by 10-layer lamination. Further, the laminate was CIP-formed and fired at 950° C. From an X-ray diffraction pattern at this time, it was confirmed that the laminate had a pseudo-cubic perovskite structure, and the peak intensity in (100) and (200), which was its secondary reflection, was strong. Based on the above, it was found that an anisotropically shaped powder in which the crystal face in the (100) plane was oriented was obtained.

Example 2

Next, an example in which the conditions are similar to those of Example 1, but the size of the container is increased 20 times will be described as Example 2.

First, KOH and NaOH were mixed in the proportion of K/Na=1.5, and the mixture was weighed so as to be KOH+NaOH=6 mol/l, and then dissolved in ion-exchange water.

Next, 25 g of a $Nb_2O_5$ powder having a median radius of 200 nm and having an orthorhombic structure was weighed and added to 800 ml of the previously made KOH+NaOH solution. In addition, 0.8 wt % of a surfactant SDBS with respect to the $Nb_2O_5$ powder was further added and stirred.

The thus obtained mixed solution was placed in a Teflon-lined autoclave container and sealed, and then heated at 200° C. for a predetermined time. After cooling, the container was opened, and the reaction product was removed. The reaction product was washed with ethanol several times and dried, and the powder was removed. The amount of the obtained reaction product was about 40 g and increased to about 20 times that of Example 1, which showed good reactivity.

Next, after the washing was completed, the reaction product was dried at 150° C., and then the reaction product was fired at 450° C.

Then, an X-ray diffraction pattern in a case where heating was performed for 4 hours was checked. A result substantially matching the reference pattern shown in FIG. 13 was obtained.

In addition, an SEM image was observed. It was observed that the obtained powder had an average major axis of 2 μm and an average thickness of 0.15 μm (150 nm) as in Example 1.

Example 3

Next, an example in which the conditions are substantially similar to those of Example 2, but the amounts of the $Nb_2O_5$ powder and the surfactant were changed will be described as Example 3.

First, KOH and NaOH were mixed in the proportion of K/Na=1.5, and the mixture was weighed so as to be KOH+NaOH=6 mol/l, and then dissolved in ion-exchange water.

Next, 50 g of a $Nb_2O_5$ powder having a median radius of 200 nm and having an orthorhombic structure was weighed and added to 800 ml of the previously made KOH+NaOH solution. In addition, 0.8 wt % of a surfactant SDBS with respect to the $Nb_2O_5$ powder was further added and stirred.

The thus obtained mixed solution was placed in a Teflon-lined autoclave container and sealed, and heated at 200° C. for a predetermined time. After cooling, the container was opened, and the reaction product was retrieved.

As a result, according to form observation with an X-ray diffraction pattern and SEM image of the obtained powder, results similar to those of the above-described Example 1 were obtained.

Example 4

Next, an example in which the conditions are substantially similar to those of Example 2, but the amounts of the $Nb_2O_5$ powder and the surfactant were further increased will be described as Example 4.

First, KOH and NaOH were mixed in the proportion of K/Na=1.5, and the mixture was weighed so as to be KOH+NaOH=6 mol/l, and then dissolved in ion-exchange water.

Next, 75 g of a $Nb_2O_5$ powder having a median radius of 200 nm and having an orthorhombic structure was weighed and added to 800 ml of the previously made KOH+NaOH solution. In addition, 0.8 wt % of a surfactant SDBS with respect to the $Nb_2O_5$ powder was further added and stirred.

The thus obtained mixed solution was placed in a Teflon-lined autoclave container and sealed, and heated at 200° C. for a predetermined time. After cooling, the container was opened, and the reaction product was retrieved. According to form observation with an X-ray diffraction pattern and SEM image of the obtained powder, results similar to those of the above-described Example 1 were obtained.

Example 5

Next, an example in which the conditions are substantially similar to those of Example 2, but all the raw materials were doubled will be described as Example 5.

First, KOH and NaOH were mixed in the proportion of K/Na=1.5, and the mixture was weighed so as to be KOH+NaOH=12 mol/l, and then dissolved in ion-exchange water.

Next, 50 g of a $Nb_2O_5$ powder having a median radius of 200 nm and having an orthorhombic structure was weighed and added to 800 ml of the previously made KOH+NaOH solution. In addition, 0.8 wt % of a surfactant SDBS with respect to the $Nb_2O_5$ powder was further added and stirred.

The thus obtained mixed solution was placed in a Teflon-lined autoclave container and sealed, and heated at 200° C. for a predetermined time. After cooling, the container was opened, and the reaction product was retrieved. According to form observation with an X-ray diffraction pattern and SEM image of the obtained powder, results similar to those of the above-described Example 1 were obtained.

Example 6

Further, a case in which the conditions are substantially similar to those of Example 1, but the amounts of the KOH+NaOH solution, the $Nb_2O_5$ powder, and the surfactant were changed will be described as Example 6.

First, KOH and NaOH were mixed in the proportion of K/Na=1.5, and the mixture was weighed so as to be KOH+NaOH=6 mol/l, and then dissolved in ion-exchange water.

Next, 1.27 g of a $Nb_2O_5$ powder having a median radius of 200 nm and having an orthorhombic structure was weighed and added to 15 ml of the previously made KOH+NaOH solution. In addition, 2 wt % of a surfactant SDBS with respect to the $Nb_2O_5$ powder was further added and stirred.

The thus obtained mixed solution was placed in a Teflon-lined autoclave container and sealed, and heated at 200° C. for a predetermined time. After cooling, the container was opened, and the reaction product was retrieved. An X-ray diffraction pattern of the obtained powder was checked. A result similar to that of Example 1 was obtained. In addition, an SEM image was observed. It was observed that the obtained powder had an average major axis of 1.5 μm on and an average thickness of 0.15 μm (150 nm).

Comparative Example 1

Figure 15:
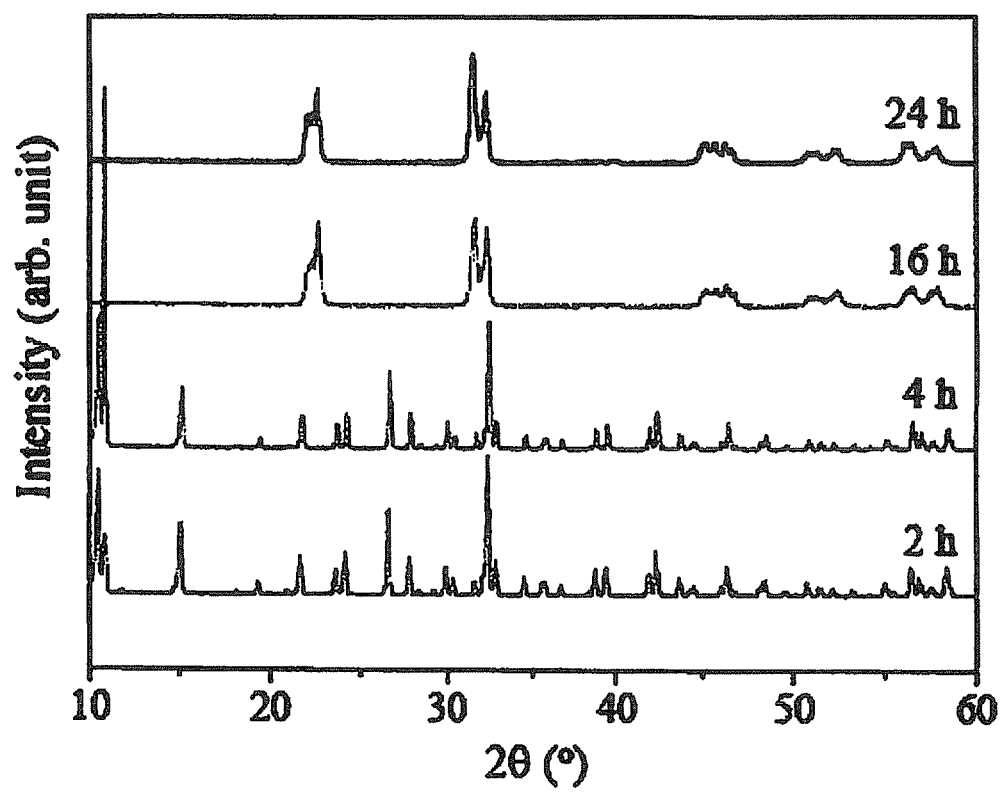
FIG. 15 is an explanatory diagram showing examples of X-ray diffraction patterns of powders made by a production method that is a Comparative Example.

On the other hand, an example in which a powder is produced using a production process and conditions similar to those of Example 1, but the surfactant SDBS is not added will be given as a Comparative Example. X-ray diffraction patterns of powders obtained with the heating times in hydrothermal synthesis being 2 hours, 4 hours, 16 hours, and 24 hours respectively are shown in FIG. 15. According to FIG. 15, the X-ray diffraction patterns for the powders obtained in 2-hour heating and 4-hour heating matched the X-ray diffraction pattern of $K_4Na_3Nb_6O_{19}$-$9H_2O$ shown in FIG. 13 as the reference pattern, in many portions, and the main component was presumed to be $K_4Na_3Nb_6O_{19}$-$9H_2O$. But, when the heating time was more than 16 hours, the X-ray diffraction patterns were largely different from the example in FIG. 13, and it was presumed that the main component of the powders made was different from $K_4Na_3Nb_6O_{19}$-$9H_2O$.

Figure 5:
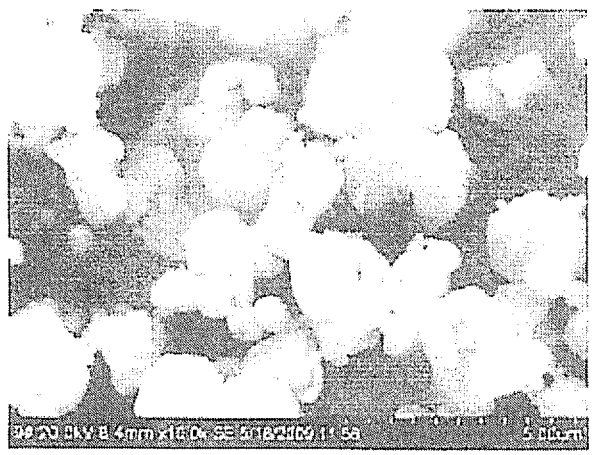
FIG. 5 is an explanatory diagram showing an example of an SEM image of K$_4$Na$_3$Nb$_6$O$_{19}$-9H$_2$O when a surfactant is not used.

Further, referring to their SEM images, the powder obtained by 16-hour heating had a perovskite structure, and no plate-like crystals were noted. In addition, an SEM image of the powder obtained by 4-hour heating is shown in FIG. 5. The powder was rounded compared with the crystals of Example 1 illustrated in FIG. 14, and had a structure in which it was difficult to obtain crystal-oriented ceramics.

Comparative Example 2

Figure 16A:
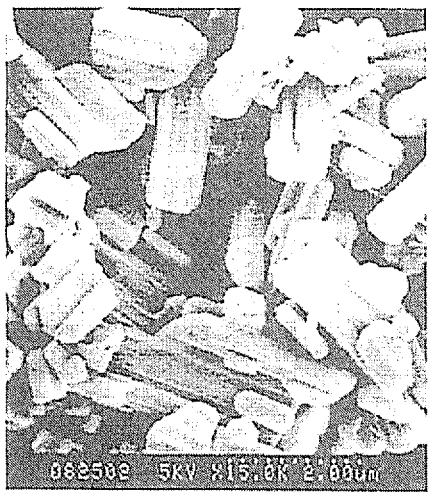
FIG. 16 is an explanatory diagram showing an example of an SEM image and X-ray diffraction pattern of niobium oxide that is a Comparative Example.
Figure 16B:
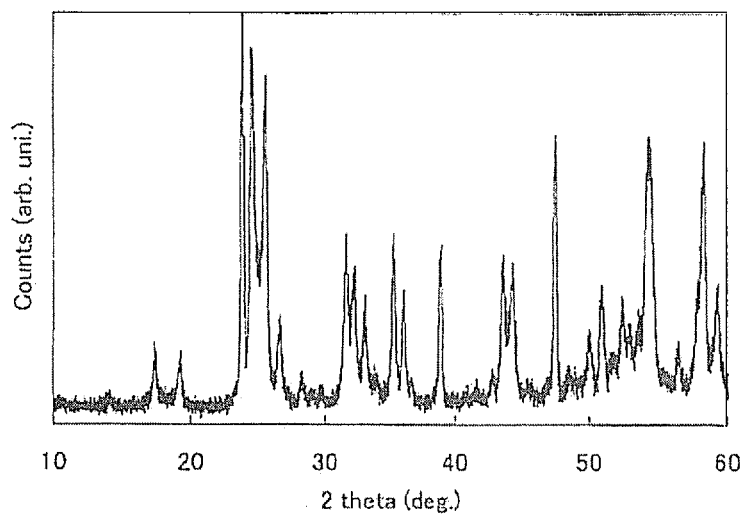

Next, a product was obtained through production steps similar to those of Example 1, using a $Nb_2O_5$ powder having a median radius of 2000 nm and having a monoclinic structure. A particle SEM image (acceleration voltage 5 kV, 15000×) and X-ray diffraction pattern of the $Nb_2O_5$ powder used here are shown in FIGS. 16(a) and 16(b). From FIG. 16, this $Nb_2O_5$ powder having an average particle size of 2000 nm and having a monoclinic structure exhibited a columnar shape of 2 μm or more and had a monoclinic crystal structure, and therefore was considered to be unsuitable for forming a plate-like shape.

Figure 17:
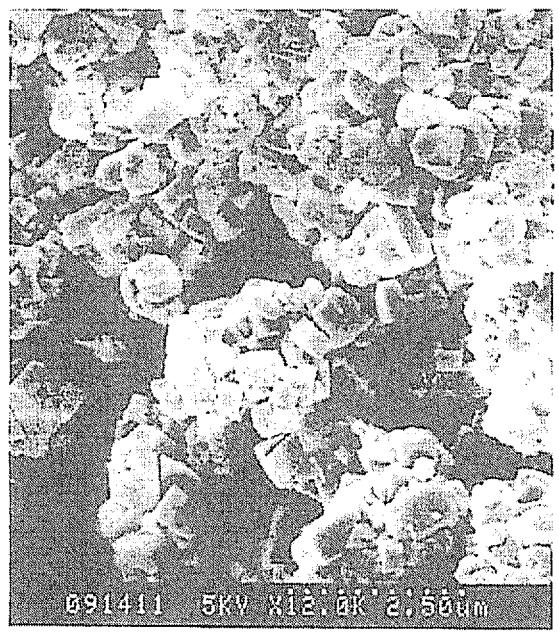
FIG. 17 is an explanatory diagram showing an example of an SEM image of a powder that is a Comparative Example.

An SEM image (acceleration voltage 5 kV, 12000×) of the reaction product after hydrothermal synthesis was performed at a temperature of 200° C. for 4 hours in this example is shown in FIG. 17. From FIG. 17, it was found that plate-like crystals were not formed, and the reaction product had a perovskite structure having a dice-like (generally cubic shape) particle shape.

The invention claimed is:

1. A method for producing an anisotropically shaped powder, comprising the steps of:
   performing hydrothermal synthesis on an aqueous alkali hydroxide solution to which an oxide powder and a surfactant have been added;
   washing a product obtained after the hydrothermal synthesis, with an organic solvent; and
   firing the product, after the washing, at 170° C. to 700° C.

2. The method for producing an anisotropically shaped powder according to claim 1, wherein the oxide powder is $Nb_2O_5$ having a median radius of 100 nm to less than 2000 nm and having an orthorhombic crystal structure.

3. An anisotropically shaped powder being plate crystals made using the production method according to claim 2, the anisotropically shaped powder having a ratio of an average particle length in a major axis direction to an average particle length in a thickness direction in a range of 2 to 20 and having a pseudo-cubic perovskite structure in which a face of the plate crystal is oriented in a (100) plane, wherein the anisotropically shaped powder includes $K_4Na_3Nb_6O_{19} \cdot 9H_2O$.

* * * * *

UNITED STATES PATENT AND TRADEMARK OFFICE
CERTIFICATE OF CORRECTION

PATENT NO. : 9,090,512 B2  
APPLICATION NO. : 13/510459  
DATED : July 28, 2015  
INVENTOR(S) : Tomoaki Karaki et al.

Page 1 of 1

It is certified that error appears in the above-identified patent and that said Letters Patent is hereby corrected as shown below:

In the specification

Column 4, line 6, "$K_4Na_3Nb_6O_{19}$-$9H_2O$" should be --- $K_4Na_4Nb_6O_{19}$-$9H_2O$ ---.

Column 4, line 8, "$K_4Na_3Nb_6O_{19}$-$9H_2O$" should be --- $K_4Na_4Nb_6O_{19}$-$9H_2O$ ---.

Column 4, line 11, "$K_4Na_3Nb_6O_{19}$-$9H_2O$" should be --- $K_4Na_4Nb_6O_{19}$-$9H_2O$ ---.

Column 4, line 13, "$K_4Na_3Nb_6O_{19}$-$9H_2O$" should be --- $K_4Na_4Nb_6O_{19}$-$9H_2O$ ---.

Column 4, line 30, "$K_4Na_3Nb_6O_{19}$-$9H_2O$" should be --- $K_4Na_4Nb_6O_{19}$-$9H_2O$ ---.

Column 5, line 50, "$K_4Na_3Nb_6O_{19}$-$9H_2O$" should be --- $K_4Na_4Nb_6O_{19}$-$9H_2O$ ---.

Column 9, line 41, "$K_4Na_3Nb_6O_{19}$-$9H_2O$" should be --- $K_4Na_4Nb_6O_{19}$-$9H_2O$ ---.

Column 9, line 49, "$K_4Na_3Nb_6O_{19}$-$9H_2O$" should be --- $K_4Na_4Nb_6O_{19}$-$9H_2O$ ---.

Column 9, line 51, "$K_4Na_3Nb_6O_{19}$-$9H_2O$" should be --- $K_4Na_4Nb_6O_{19}$-$9H_2O$ ---.

Column 12, line 17, "$K_4Na_3Nb_6O_{19}$-$9H_2O$" should be --- $K_4Na_4Nb_6O_{19}$-$9H_2O$ ---.

Column 12, line 19, "$K_4Na_3Nb_6O_{19}$-$9H_2O$" should be --- $K_4Na_4Nb_6O_{19}$-$9H_2O$ ---.

Column 12, line 23, "$K_4Na_3Nb_6O_{19}$-$9H_2O$" should be --- $K_4Na_4Nb_6O_{19}$-$9H_2O$ ---.

In the claims

Column 13, line 5, "$K_4Na_3Nb_6O_{19}$-$9H_2O$" should be --- $K_4Na_4Nb_6O_{19}$-$9H_2O$ ---.

Signed and Sealed this  
Ninth Day of February, 2016

Michelle K. Lee  
*Director of the United States Patent and Trademark Office*